United States Patent [19]

Schwarz et al.

[11] Patent Number: 4,670,080

[45] Date of Patent: Jun. 2, 1987

[54] PROCESS AND APPARATUS FOR PRODUCING METAL-LAMINATED BASE MATERIAL FOR PRINTED CIRCUIT BOARDS

[75] Inventors: Lothar Schwarz; Friedel Ueberberg, both of Lindlar; Rudolf Kuehne; Dieter Fischer, both of Cologne, all of Fed. Rep. of Germany

[73] Assignee: President Engineering Corp., Zurich, Switzerland

[21] Appl. No.: 719,111

[22] Filed: Apr. 2, 1985

[30] Foreign Application Priority Data

Apr. 10, 1984 [DE] Fed. Rep. of Germany ....... 3413434
Feb. 4, 1985 [EP] European Pat. Off. ......... 85101282.3

[51] Int. Cl.$^4$ .............................................. C09J 5/06
[52] U.S. Cl. .............................. 156/307.5; 156/307.7; 156/322; 156/324; 156/583.5
[58] Field of Search ............... 156/307.3, 307.4, 307.5, 156/307.7, 322, 324, 583.5

[56] References Cited

U.S. PATENT DOCUMENTS 3,208,894 9/1965 Yanagihara et al. ........ 156/307.4 X
3,463,698 8/1969 Yanagihara et al. ........ 156/307.5 X
4,400,438 8/1983 Takahashi et al. .......... 156/307.7 X
4,402,778 9/1983 Goldsworthy ............... 156/307.7 X
4,420,359 12/1983 Goldsworthy ............... 156/307.7 X
4,466,847 8/1984 Held ............................ 156/307.4 X

FOREIGN PATENT DOCUMENTS 2108427 5/1983 United Kingdom .

Primary Examiner—Robert A. Dawson
Attorney, Agent, or Firm—Wenderoth, Lind & Ponack

[57] ABSTRACT

A metal-laminated base material for printed circuit boards is produced in a double-belt press. Sheets of laminated material impregnated with an accelerated resin system and prehardened are preheated in a preheating zone, before running into a pressure-effective zone of the double-belt press, and are supplied together with the metal foils to the heating region of the pressure-effective zone. Here, the individual layers are pressed to form the base material. The base material is preferably cooled under pressure in a cooling region of the pressure-effective zone, if appropriate heat-treated, trimmed at the edges and cut to length. The process provides uniform base-material boards of perfect quality.

19 Claims, 1 Drawing Figure

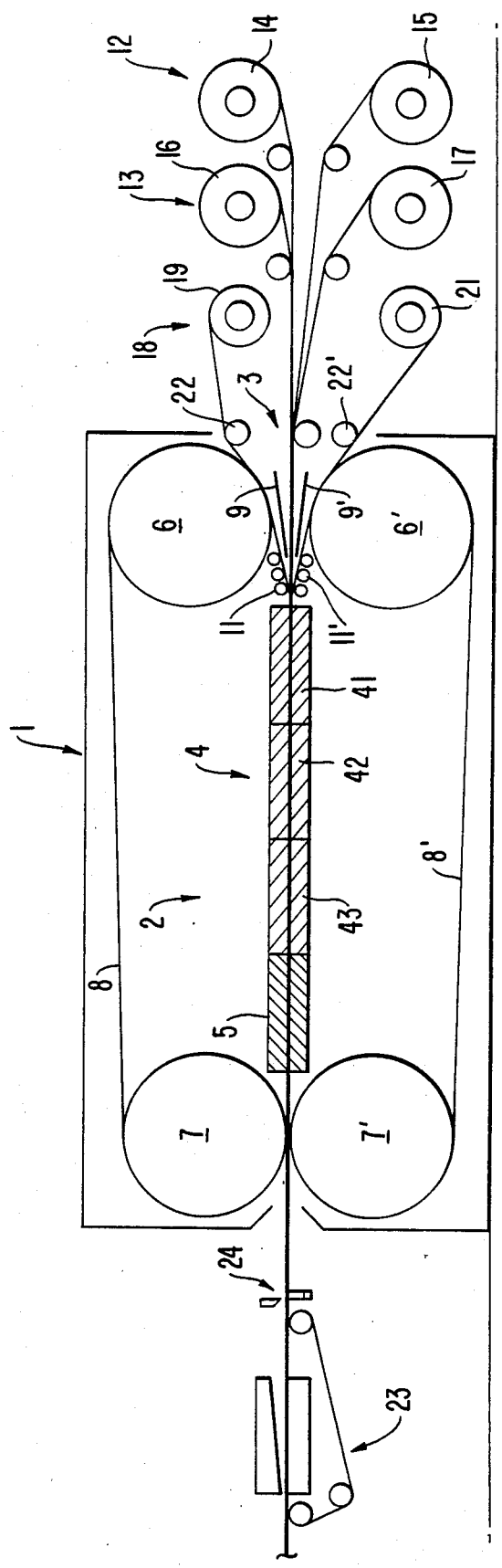

PROCESS AND APPARATUS FOR PRODUCING METAL-LAMINATED BASE MATERIAL FOR PRINTED CIRCUIT BOARDS

BACKGROUND OF THE INVENTION

The present invention relates to a process for continuously producing metal-laminated base materials for printed circuit boards.

Metal-laminated base materials for printed circuit boards are generally produced discontinuously when cut-to-size laminated material, provided with thermosetting resin, and metal foils are pressed in multiple-daylight presses. Such a process is expensive and supplies base materials of a quality which varies within the individual board. There has therefore long been a desire for a continuous process.

A step towards continuity is shown in British Patent Application No. 2,108,427 which describes a process in which intermittent pressing is carried out in a press having two heated plates, in such a way that a sheet of fabric and a copper foil which are introduced into the press are each stationary during the pressing operation and the press product is ejected periodically. The product of this process therefore consists of individual portions, the dimensions of which are limited by those of the heated plates and which are joined to one another by non-pressed, that is to say unusable, portions. Even here, the quality varies within the individual board, and when the consumer demands a uniform quality this results in large quantities of rejects.

SUMMARY OF THE INVENTION

The object of the present invention is to provide a continuous process and apparatus for producing base material for printed circuit boards.

This object is achieved by means of the pressureless preheating of a sheet of laminated material provided with an accelerated and prehardened thermosetting resin system, thus making it possible to use a suitable double-belt press and consequently allowing the continuous production of metal-laminated sheets of base material of perfect quality. This is extremely surprising, especially when it is remembered that a hardened resin, that is to say one which has finished reacting, is inert and no longer forms a bond, and that the hardening reaction of the accelerated, already prehardened resin system is further advanced as a result of the preheating of the sheets of laminated material. The great degree of surprise experienced by the experts emerges particularly clearly in light of the abovementioned G.B. application since, to avoid an undesirable prereaction, such teaching recommends cooling the resin after application and before the press, that is to say reserving the entire reactivity of the resin for forming the bond between the individual layers during the pressing operation. If it is remembered that this recommendation is for a normally hardening, that is to say non-accelerated and non-prehardened resin, the measure according to the invention, namely that of preheating a resin which has already lost some of its reactivity as a result of prehardening and the reactivity of which disappears at a faster rate as a result of acceleration during heating, appears to be sheer nonsense. However, this preheating measure, directly contradicting the recommendation of the state of the art, in actual fact makes it possible to achieve the continuous production of metal-laminated base material for printed circuit boards. Obviously, as a result of the pre-reaction caused by mans of preheating the accelerated and prehardened resin, the resin is activated for the subsequent reaction under pressure, so that a sudden bond is made in the press itself.

As a result of the process according to the invention, the differences observed in a discontinuous process or in the intermittent process described above between edge regions of lower quality and a high-quality middle part of the individual boards are eliminated, so that the base material obtained has a uniformly high quality and can be cut to length to form boards of uniform quality.

The mode of operation of double-belt presses is known, for example from the production of decorative laminates. However, more stringent requirements are demanded in terms of pressure and temperature from double-belt presses for the process according to the invention. The same applies to the dimensional stability and surface quality of the products leaving the press. Double-belt presses of a suitable type are described, for example, in Europan Patent Application Nos. 0,026,396 and 0,026,401.

The individual layers provided with a thermosetting resin system are preferably brought together in front of the preheating zone of the double-belt press. The resin system is already prehardened here, usually up to the B-state. The aim here is preferably to achieve a more advanced B-state, that is to say with less resin flux, than during prehardening for multiple-daylight pressing. The multi-layer structure is generally heated uniformly in the preheating zone preceding the pressure-effective zone of the press. Because of the lowering of viscosity when the resin becomes soft and ductile, any unevenness which may exist is already compensated at this stage. The preheating temperature is dependent on the particular resin system, but is preferably approximately 80° to 100° C. The multi-layer structure passes from the preheating zone approximately at 100° C. into the pressure-effective zone, being combined immediately beforehand with one or two, preferably separately preheated metal foils and advantageously being pressed at an increasing temperature of, for example, 150° to 210° C. at 25 to 80 bar. The base material now formed from several layers is subsequently cooled, preferably under pressure, especially with the pressing force being maintained, advantageously to below the second-order transition temperature of the resin, and if appropriate is further heat-treated and cut into lengths. Cooling under pressure, that is to say in the press, serves for stabilising the high quality of the base material achieved as a result of the continuous process, especially for preventing deformation.

Examples of resins which can be employed as an accelerated thermosetting resin system are epoxy, polyester, phenol resins, triacin and others.

An epoxy hardener/catalyst system is advantageously used as an accelerated thermosetting resin system, and the following pyridine compounds, among others, are suitable as accelerators:

2-Benzoylpyridine
3-Benzoylpyridine
4-Benzoylpyridine
2-Benzylpyridine
3-Benzylpyridine
4-Benzylpyridine
2-Benzylaminopyridine
4-Dimethylaminopyridine
2-Methoxypyridine 4-tert.-Butylpyridine
3-Cyanopyridine
2-Hydroxypyridine
6-Amino-2-pyridine
2-Aminopyridine
3-Ethylpyridine
3-Ethyl-4-methylpyridine
2-Phenylpyridine
2,6-Diaminopyridine
3-Methylpyridine
2-(Aminomethyl)-pyridine
2-Amino-4-methylpyridine
2,4-Dimethylpyridine.

A second advantageous group of accelerators are substituted imidazole compounds known per se, including imidazole itself, specifically:
N-Methylimidazole
2-Methylimidazole
2-Phenylimidazole
4-Phenylimidazole
4-Methylimidazole
2-Methylbenzimidazole
5,6-Dimethylbenzimidazole
1-Methyl-2-phenylbenzimidazole
1,2-Dimethylimidazole
4,5-Diphenylimidazole
2-Ethyl-4-methylimidazole
Carbonyldiimidazole
Imidazole
2-Undecylimidazole
1-Cyanoethyl-2-phenylimidazole
2-Phenylbenzimidazole.

Particularly good results are obtained by means of a combination of dicyanodiamide or benzyldimethylamine with the abovementioned pyridines or imidazoles. At the same time, according to the invention, the general aim is to achieve greater acceleration than in known resin systems, above all to obtain an economical throughflow speed in the press.

The following are to be considered as further substantial advantages of the process according to the invention:
    the most efficient possible utilisation for blank production, since the continuous sheet can be cut into lengths as required;
    the saving of material, since trimming on two sides only is necessary;
    the saving of energy, since the cooling operation and consequently the dissipation of energy in the multiple-daylight press process are avoided;
    an improvement in the quality of the laminate, especially the dimensional stability;
    a reduction in the reject rate because of a cleaner copper-foil surface.

In comparison with the discontinuous production process in so-called multiple-daylight presses, there are substantial savings in terms of working operations, specifically the cross-cutting of the prepregs to format length, the cross-cutting of the metal foil to format length, the preliminary transfer of the prepreg stacks, the build-up of the laminate stacks and the separation of the laminate stacks, the costly pressure plates are omitted, and the backing paper which can be used only once is avoided.

BRIEF DESCRIPTION OF THE DRAWING

The invention now will be explained in more detail with reference to an exemplary embodiment, illustrated in the attached drawing, of an apparatus suitable for carrying out the process according to the invention.

DETAILED DESCRIPTION OF THE INVENTION

The apparatus illustrated in the drawing has a double-belt press 1 with a pressure-effective zone 2 and, preceding this, a pressureless preheating zone 3. The pressure-effective zone 2 is subdivided into a longer heating region 4 adjoining the preheating zone 3 and a shorter cooling region 5 following the heating region. The heating region 4 in turn has three temperature regions 41, 42, 43 controllable independently of one another. The double-belt press 1 has, in front of the pressure-effective zone 2, a pair of heated draw-in deflecting cylinders 6,6' arranged at a relatively great distance from one another, after the pressure-effective zone 2 a correspondingly designed pair of draw-out deflecting cylinders 7,7' arranged at a shorter distance from one another, and, following the pair of draw-in deflecting cylinders 6,6', supporting rollers 11,11' for pressure belts 8,8' of the double-belt press 1. To keep the temperature constant, the preheating zone 3 is delimited by means of a pair of heat shields 9,9' from the pressure belt 8,8' of the double-belt press 1, such pressure belts 8, 8' being heated by drawn-in deflecting cylinders 6, 6'. The pair of heat shields are cooled plates. Cooling coils, here consisting of copper, serve for cooling, and in these, the throughflow speed of the coolant can be controlled, so that precise temperature control is possible. Instead of the cooling coils, cooling pockets with positive guidance can also be provided. The heat shields 9,9' are arranged so as to be displaceable in the horizontal direction, so that the temperature-controlled preheating zone can be brought nearer to or further away from the pressure-effective zone 2, that is to say can also be controlled as regards its arrangement spatially.

The operating principle of the double-belt press used according to the invention is based on the fact that the pressure exerted on the sheet of material moved continuously through the press is uniform over the width of this sheet of material and is also constant in time. This occurs here because the pressure is transmitted from pressure pads (not shown) located in the press to the endless steel pressure belts, 8, 8' which run through the press in synchronism with the sheet of material and which at the same time serve as finishers. Pressure belts of relatively large mass, for example steel belts approximately 2 mm thick, guaranteeing good heat transfer are preferably used.

The heating region 4 of the press 1 has a length of, for example, 3 m, a maximum overall length of the entire double-belt press 1, that is to say of the entire pressure zone, of 4 m being intended. In this case, the preheating zone 3 preferably has a length of 40 to 100 cm. The cooling region 5 has a length of 1 m in the advantageous exemplary embodiment illustrated.

Spindle unwinders 12, 13, each with two spindles 14–17 for prepregs, that is to say glass-fibre (fabrics or cloths) or paper laminates provided with the resin system, and a further spindle unwinder 18 with two spindles 19, 21 for metal foils are arranged in front of the double-belt press. Guide rollers 22, 22' for the metal foils are provided between the spindle unwinder 18 and the double-belt press 1.

Located behind the double-belt press in the production direction are an edge-trimming device 23 and subsequently a cutting-to-length device 24.

During operation, four prepreg sheets, that is to say laminated material provided with a resin hardener/accelerator system and prehardened up to the advanced B-state, are drawn off from the spindle unwinders 12, 13, brought together and fed to the preheating zone 3, where the four-layer structure is heated under pressureless conditions to a temperature of approximately 80° to 100° C. as a function of the particular resin system. At the same time, metal foils are supplied from the two spindles 19, 21 of the spindle unwinder 18, are guided, separately from the prepregs, between the particular heat shield 9 or 9' and the pressure belt 8 or 8', and are combined with the prepregs immediately in front of the pressure-effective zone 2. Whereas the temperature in the preheating zone is up to 100° C., as indicated, the temperature of the draw-in cylinder is higher, so that the copper foils are heated to a greater degree than the prepregs. In the three temperature regions 41, 42, 43 of the heating region 4 of the pressure-effective zone 2, the combined individual layers are pressed into the sheet of base material at a pressure of over 25 bar and at a temperature increasing from 150° to approximately 190° C. and are bonded as a result of the hardening of the still reactive resin. The temperature of the first temperature region 41 is lower than that of the second 42 which can be equal to that of the third 43 and which amounts to 190° to 200°. In the subsequent cooling region 5, the sheet of base material is cooled under pressure. At this difficult stage, the application of pressur prevents a reduction in quality, especially deformation of the product. The sheet of base material, cooled to approximately 100° C., now leaves the cooling region 5. In the subsequent edge-trimming device 23, the pressed edges are removed on both sides of the sheet of base materials, whereupon it is cut to a desired length in the cutting-to-length device 24.

A secondary heat-treatment zone for the dimensional stabilisation of the base material can be provided between the cooling zone and the edge-trimming device.

Advantageously, the apparatus illustrated works with a retention time in the heating region 4 which corresponds to a feed speed within the double-belt press of approximately 3 m/min. The retention time and feed speed are dependent on the hardening temperature and the reaction rate of the resin/hardener/accelerator system used.

When base material laminated on one side only is produced, there can be, instead of the metal foil, a heat-resistant separating foil wound onto the appropriate spindle and running into the double-belt press. The separating foil used can be, for example, an aluminum foil which is silicone-treated or laminated with polytetrafluoroethylene. After running out of the double-belt press, the separating foil can be drawn off from the finished sheet of base material and used again.

Although the process according to the invention has been described with reference to a six-layer base material, base materials with a different number of layers can of course also be produced.

The operating conditions described depend primarily on the resin system used and can be varied accordingly.

The process according to the invention and the apparatus according to the invention can be used for laminating with copper, and also for laminating with other metal foils. In particular, they are suitable for laminating with combination foils, for example CU/Al, such as are used for high-precision printed circuit boards (so-called etchable/strippable boards).

The invention is further illustrated by means of the following examples:

EXAMPLE 1

A glass fabric in finished form, such as is conventionally used in copper-laminated glass-fibre/epoxy-resin laminates for printed circuit boards, with a weight of 200 g/m$^2$ was saturated with a resin solution consisting of 100 parts of a polymeric partially brominated bisphenol-A-glycidyl ether with a proportion of epoxidised novolak of 1 to 15%, preferably 5 to 12%, 3.2 parts of dicyanodiamide, 0.28 parts of 3-methylpyridine and 80 parts of methyl glycol. The prepreg saturated in this way and dried at 165° C. had a resin content of 42% and a resin flux of 10%. Seven of these prepregs, after being preheated to 80° C., were pressed in a continuous flow at a temperature increasing from 150° to 195° C., under a pressure of 45 bar, on the apparatus according to the invention, together with a double-sided copper-foil coating 35 $\mu$m thick to form a laminate 1.5 mm thick. Testing of the laminate surprisingly produced above-average positive results as regards dimensional stability, with properties otherwise equivalent to conventional laminates.

The laminate obtained has a thickness tolerance of ±3/100 mm. By way of comparison, the standards for rigid laminates provide for a tolerance of ±13/100 mm which indeed is fully utilised by products obtained on a multiple-daylight press.

EXAMPLE 2

A glass fabric such as that described in Example 1 was saturated with a resin solution consisting of 100 parts of a polymeric partially brominated bisphenol-A-glycidyl ether with a proportion of epoxidised novolak of 1 to 15%, preferably 5 to 12%, 3.4 parts of dicyanodiamide, 0.33 parts of 4-dimethylaminopyridine and 80 parts of methyl glycol. The prepreg saturated in this way and dried at 170° C. had a resin content of 44% and a resin flux of 8%. Several of these prepregs, after being preheated to 85° C., were pressed in a continuous flow together with a double-sided copper-foil coating 35 $\mu$m thick, at a temperature increasing from 155° to 200° C. and under a pressure of 50 bar, on the apparatus.according to the invention to form a laminate 1.5 mm thick. In this version also, testing of the laminate produced above-standard values as regards dimensional stability, with laminate properties otherwise comparable to those of conventional products.

EXAMPLE 3

A glass fabric with a weight of 100 g/m$^2$ and intended for the same use as stated in Example 1 was saturated with a resin mixture consisting of 100 parts of a polymeric partially brominated bisphenol-A-glycidyl ether with a proportion of epoxidised novolak of 1 to 15%, preferably 5 to 12% and with an epoxy equivalent weight of between 350 and 520, 3.0 parts of dicyanodiamide, 0.40 parts of 2-amino-4-methylpyridine and 80 parts of methyl glycol, and was dried at 165° C. The resin content was 44% and the resin flux was 10%. Two of these prepregs, after being preheated to 80° C., were pressed in a continuous flow together with a single-sided copper-foil coating 35 $\mu$m thick, using a separating foil, on the apparatus according to the invention, at a temperature increasing from 150° to 190° C. and under a pressure of 50 bar, to form a laminate 0.2 mm thick. Testing produced results as good as those in Example 2.

EXAMPLES 4 TO 13

The compositions and operating conditions of Examples 4 to 13 are set out in the following Table.

| Example | 4 | 5 | 6 | 7 | 8 | 9 | 10 | 11 | 12 | 13 |
|---|---|---|---|---|---|---|---|---|---|---|
| Proportion of resin | 100 | 100 | 100 | 100 | 100 | 100 | 100 | 100 | 100 | 100 |
| Epoxy equivalent weight | 350/520 | 350/520 | 400/500 | 400/500 | 360/410 | 360/410 | 360/410 | 360/500 | 360/500 | 360/500 |
| Proportion of epoxidised novolak in the basic resin | 5 | 5 | 5 | 5 | 10 | 10 | 10 | 5 | 10 | 15 |
| Dicyanodiamide | 3.3 | 3.3 | 3.3 | 3.0 | 3.0 | 3.4 | 3.1 | 3.2 | 3.2 | 3.0 |
| Methyl glycol | 80 | 80 | 80 | 80 | 80 | 80 | 80 | 80 | 80 | 80 |
| Benzyldimethylamine | 0.10 | | 0.15 | 0.10 | | 0.20 | | | 0.14 | 0.18 |
| Carbonyldiimidazole | 0.17 | | | | | | | 0.24 | | |
| 4-Methylimidazole | | 0.27 | | | | 0.21 | | | | |
| 2-Methylimidazole | | | 0.28 | | | | 0.15 | | | |
| 2-Methylbenzimidazole | 0.22 | | | | | | 0.18 | | | |
| 2-Phenylimidazole | | | | 0.30 | 0.21 | | | | | |
| 2-Ethyl-4-methylimidazole | | | | | 0.21 | | | 0.22 | | 0.29 |
| 2-Amino-4-methylpyridine | | | | | | | 0.28 | | 0.30 | |
| 4-Dimethylaminopyridine | | 0.2 | | 0.19 | | | | | | |
| 4-tert.-Butylpyridine | | | 0.16 | | | 0.17 | | | | |
| 3-Benzylpyridine | | | | | 0.25 | | | 0.15 | | |
| Glass fabric g/m² | 200 | 200 | 200 | 200 | 200 | 100 | 100 | 48 | 100 | 48 |
| Coating temperature in prepreg production | 160 | 160 | 170 | 165 | 165 | 170 | 160 | 165 | 165 | 160 |
| Resin content | 43 | 43 | 44 | 44 | 43 | 49 | 48 | 50 | 50 | 60 |
| Resin flux | 8 | 9 | 8 | 10 | 9 | 11 | 10 | 8 | 9 | 8 |
| Press temperature (maximum) | 195 | 190 | 190 | 195 | 190 | 190 | 195 | 195 | 190 | 190 |
| Pressing force in bar | 40 | 45 | 50 | 50 | 50 | 45 | 50 | 45 | 45 | 40 |
| Laminate thickness in mm | 1.6 | 1.5 | 1.6 | 1.2 | 1.0 | 0.17 | 0.54 | 0.05 | 0.25 | 0.15 |
| Copper coating 35 μe = on one side/z = on two sides | e | z | e | z | z | z | z | z | z | z |
| Separating foil | x | — | x | — | — | — | — | — | — | — |

We claim:

1. A process for continuously producing metal-laminated base material for printed circuit boards, said process comprising:
   providing sheets of material impregnated with a curable accelerated resin prehardened to the B stage;
   continuously passing said impregnated sheets of material through a pressureless preheating zone, without applying pressure to said sheets and thereby preheating said sheets of material and lowering the viscosity of said resin, and allowing said resin to react and accelerate beyond the B stage in said pressureless zone; and
   continuously passing the thus preheated sheets of material impregnated with the thus reacting resin and at least one metal foil sheet into a pressure-effective zone of a double-belt press, and therein pressing together said sheets of material and metal foil sheet under pressure and increased temperature, thereby obtaining a continuous length of metal-laminated base material.

2. A process as claimed in claim 1, further comprising cutting said continuous length of metal-laminated base material to desired lengths.

3. A process as claimed in claim 1, comprising conducting said pressing at a pressure of 25 to 80 bar and at a temperature increasing from approximately 150° C. to approximately 210° C.

4. A process as claimed in claim 1, further comprising continuously cooling said continuous length of metal-laminated base material in a cooling zone within said double-belt press.

5. A process as claimed in claim 1, further comprising conducting a secondary heat treatment on said metal-laminated base material.

6. A process as claimed in claim 1, comprising pressing a single said metal foil sheet on one side only of said preheated sheets of material, continuously passing a separating foil into said pressure-effective zone in contact with the other side of said preheated sheets of material, and continuously removing said separating foil from said metal-laminated base material after passage thereof through said double-belt press.

7. A process as claimed in claim 1, further comprising preheating said metal foil separately from said sheets of material.

8. A process as claimed in claim 7, comprising preheating said metal foil to a temperature higher than said sheets of material.

9. A process as claimed in claim 1, wherein said metal foil is combined with said preheated sheets of material immediately upstream of said pressure-effective zone.

10. A process as claimed in claim 1, wherein said sheets of material comprise glass-fiber fabric sheets, and said resin comprises an accelerated epoxy hardener/catalyst system.

11. A process as claimed in claim 10, wherein said system contains as an accelerator one or more compounds from the following group: substituted pyridine compounds, imidazole, substituted imidazole, dicyanodiamide and benzyldimethylamine.

12. A process as claimed in claim 11, wherein said system contains 0.2 to 0.8% by weight of the accelerator or the accelerator mixture in relation to solid epoxy resin.

13. A heatable double-belt press for continuously producing metal-laminated base material for printed circuit boards by continuously pressing together under pressure and increased temperature at least one continuously supplied metal foil sheet and a plurality of continuously supplied sheets of material impregnated with a curable accelerated resin prehardened to the B stage, said press comprising:

an upstream pressureless preheating zone for preheating at least said sheets of material without applying pressure thereto while allowing said resin to react and accelerate beyond the B stage; and a downstream pressure-effective heating zone for pressing together said metal foil sheet and said sheets of material under said pressure and increased temperature.

14. A press as claimed in claim 13, wherein said preheating zone includes a pair of heat shields having means for controlling the temperature thereof.

15. A press as claimed in claim 14, wherein said heat shields are mounted for movement in opposite directions parallel to the direction of feed of said sheets of material into said press.

16. A press as claimed in claim 13, further comprising an upstream pair of draw-in cylinders spaced apart from each other, and a downstream pair of draw-out cylinders spaced from each other by a distance less than the spacing between said draw-in cylinders.

17. A press as claimed in claim 13, further comprising a pressure-effective cooling zone positioned downstream of said pressure-effective heating zone.

18. A press as claimed in claim 13, wherein said pressure-effective heating zone is divided into a plurality of temperature regions controllable independently of one another.

19. A press as claimed in claim 13, wherein said preheating zone includes spatially separate guide devices for said metal foil sheet and for said sheets of material.

* * * * *

UNITED STATES PATENT AND TRADEMARK OFFICE
CERTIFICATE OF CORRECTION

PATENT NO. : 4,670,080

DATED : June 2, 1987

INVENTOR(S) : Lothar Schwarz, et al

It is certified that error appears in the above-identified patent and that said Letters Patent is hereby corrected as shown below:

Column 8, claim 11, line 4, after "imidazole" (second occurrence) insert -- particularly in combination with --.

Signed and Sealed this

Twentieth Day of December, 1988

Attest:

DONALD J. QUIGG

Attesting Officer
Commissioner of Patents and Trademarks